United States Patent
Lell et al.

(10) Patent No.: US 6,844,565 B2
(45) Date of Patent: Jan. 18, 2005

(54) SEMICONDUCTOR COMPONENT FOR THE EMISSION OF ELECTROMAGNETIC RADIATION AND METHOD FOR PRODUCTION THEREOF

(75) Inventors: Alfred Lell, Maxhütte-Haidhof (DE); Volker Härle, Laaber (DE); Berthold Hahn, Hemau (DE); Johann Luft, Wolfsegg (DE)

(73) Assignee: Osram Opto Semiconductors GmbH (DE)

( * ) Notice: Subject to any disclaimer, the term of this patent is extended or adjusted under 35 U.S.C. 154(b) by 18 days.

(21) Appl. No.: 10/204,500

(22) PCT Filed: Feb. 23, 2001

(86) PCT No.: PCT/DE01/00706

§ 371 (c)(1),
(2), (4) Date: Nov. 13, 2002

(87) PCT Pub. No.: WO01/63709

PCT Pub. Date: Aug. 30, 2001

(65) Prior Publication Data

US 2003/0132454 A1 Jul. 17, 2003

(30) Foreign Application Priority Data

Feb. 24, 2000 (DE) .......................................... 100 08 584

(51) Int. Cl.[7] .............................................. H01L 29/06
(52) U.S. Cl. ........................ 257/14; 257/13; 257/96; 257/97; 257/102; 257/103
(58) Field of Search .......................... 257/13, 102, 103, 257/96, 97

(56) References Cited

U.S. PATENT DOCUMENTS

| | | | |
|---|---|---|---|
| 4,511,408 A | | 4/1985 | Holonyak, Jr. |
| 5,153,889 A | * | 10/1992 | Sugawara et al. ............ 372/45 |
| 5,636,237 A | * | 6/1997 | Terakado et al. ............. 372/46 |
| 5,821,555 A | * | 10/1998 | Saito et al. ................... 257/13 |
| 5,877,509 A | | 3/1999 | Pau et al. |
| 5,903,588 A | * | 5/1999 | Guenter et al. ............... 372/46 |
| 5,966,396 A | | 10/1999 | Okazaki et al. |
| 6,028,875 A | | 2/2000 | Knight et al. .................. 372/46 |
| 6,031,858 A | * | 2/2000 | Hatakoshi et al. ............ 372/46 |
| 6,057,565 A | * | 5/2000 | Yoshida et al. .............. 257/102 |

FOREIGN PATENT DOCUMENTS

| | | |
|---|---|---|
| DE | 28 19 843 | 11/1978 |
| EP | 0 851 542 | 7/1998 |
| FR | 2 316 747 | 1/1997 |
| JP | 06-291365 | 10/1994 |
| JP | 09-283854 | 10/1997 |
| JP | 11-097802 | 4/1999 |

OTHER PUBLICATIONS

Binari, S.C. et al.: "H, He, and Implant Isolation of N–type GaN.", *J. Appl. Phys.*, vol. 78, No. 5, pp. 3008–3011; 1995.

Kim, JK. et al.: "Low Resistance Pd/Au Ohmic Contacts to P–type GaN.", *Appl. Phys. Lett.*, vol. 73, No. 20; 1998.

Oomura, E. et al.: "Low Threshold InGaAsP/InP Buried Crescent Laser with Double Current Confinement Structure.", *IEEE Journal of Quantum Electronics*, vol. QE–17, No. 5, pp. 646; 1981.

Suzuki, M. et al.: "Low Resistance Ta/Ti contacts for P–type GaN.", *Appl. Phys. Lett.*, vol. 74, No. 2; 1999.

* cited by examiner

*Primary Examiner*—Hoai Ho
*Assistant Examiner*—Mai-Huong Tran
(74) *Attorney, Agent, or Firm*—Fish & Richardson P.C.

(57) ABSTRACT

According to the invention, a semiconductor component for the emission of electromagnetic radiation, especially light, is made that has the following features: an active layer for producing radiation, a p-type contact that is electrically connected to the active layer, an n-type contact that is electrically connected to the active layer, and a current-confining structure to define a current path, with the current-confining structure being provided between the n-type contact and the active layer.

31 Claims, 6 Drawing Sheets

Figure 1:
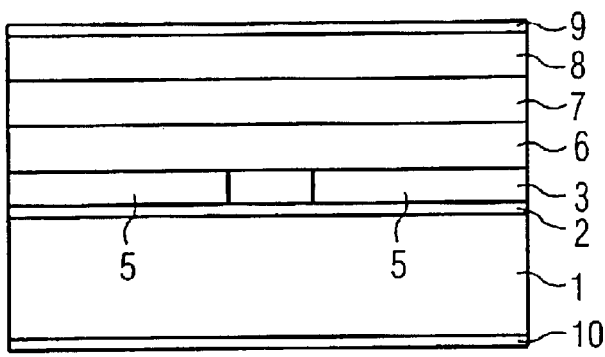

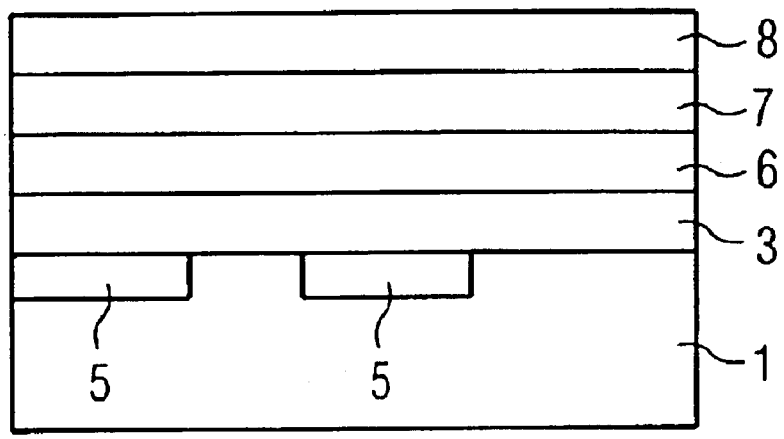
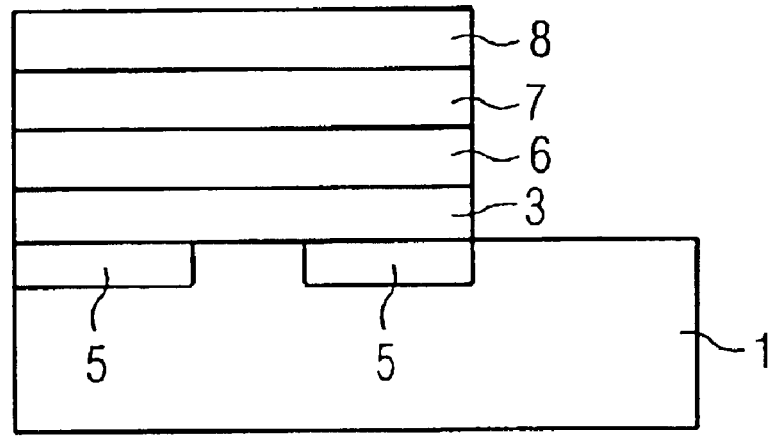

SEMICONDUCTOR COMPONENT FOR THE EMISSION OF ELECTROMAGNETIC RADIATION AND METHOD FOR PRODUCTION THEREOF

This invention relates to a semiconductor component for the emission of electromagnetic radiation and a method for producing it. The invention relates in particular to a semiconductor LED and a semiconductor laser based on gallium nitride.

Semiconductor LEDs and semiconductor lasers play an important role in many industrial systems. Semiconductor LEDs and semiconductor lasers are almost indispensable especially in communications technology, data processing, and data storage, and in the display of data. The semiconductor LEDs and semiconductor lasers usually used generally produce light in the red or infrared spectral region. For a number of reasons, for example to increase storage density, it would be desirable to use semiconductor LEDs and semiconductor lasers with shorter wavelengths. For this reason, much attention is being paid to semiconductor components based on gallium nitride, since light in the blue or ultraviolet spectral region can be produced with such semiconductor components.

For a semiconductor component to be able to produce radiation with high efficiency, it is usually necessary to limit the area through which electrical current flows to a defined structure. This confinement to a spatially clearly defined structure is ordinarily accomplished by an appropriately structured contact pad connection. However, this usually results in contact pad connections with relatively small contact surfaces. Contact resistance increases with reduced contact area, which can result in undesirable heating of the component up to the point of component failure, among other effects. This problem is particularly prominent in components with small contact connection surfaces, for example lasers, and leads to substantial impairments of component properties and of component reliability. Thus, high contact resistance in semiconductor lasers can lead to the operation of the laser being possible only in pulses or with external cooling.

Unfortunately it has turned out that contacts to (In,Al) GaN, a semiconductor with a high energy gap (Eg=3.39 eV at 300 K), are especially problematical. In particular, the high ohmic resistance of contacts to p-type GaN is considered one of the main obstacles in the realization of components based on gallium nitride. For this reason, a number of teams, institutes, and chip manufacturers are concerned with improving the conductivity of p-type contacts to p-GaN. The paper "Low-resistance Ta/Ti ohmic contacts for p-type GaN" (Suzuki et al.), Applied Physics Letters Vol. 74, Number 2 (Jan. 11, 1999), for example, discloses the use of Ta/Ti as contact material instead of the customary contact material Ni/Au, in order to reduce contact resistance. The paper "Low resistance Pd/Au ohmic contacts to p-type GaN using surface treatment" (Kim et al.), Applied Physics Letters Vol. 73, Number 20 (Nov. 16, 1998) discloses a pretreatment of the contact point with aqua regia followed by producing a contact with Pd/Au as contact material.

Unfortunately, all of these proposals have a number of drawbacks, so that further improvements are necessary. With a defined contact pad size, both a high acceptor concentration and a low Schottky barrier level are necessary for low contact resistance. Since all of the p-type dopants examined so far (Mg, Zn, Be, etc.) cause deep acceptor transitions, only a fraction of these p-type dopant atoms are electrically activated. When certain dopant levels are exceeded, phenomena of self-compensation are also observed that result in a reduction of electrical conductivity. In addition, a number of phenomena still not completely understood (for example, hydrogen passivation of the dopant and vacant nitrogen sites) lead to a reduction of p-type conductivity.

U.S. Pat. No. 5,966,396 discloses a semiconductor laser based on gallium nitride that has a mesa structure and a relatively large p-type contact to reduce contact resistance. To produce current confinement to a spatially clearly defined structure despite the large p-type contact, so-called "current blocking layers" are used, which are positioned along the sides of the mesa structure formed by the active layer and two mantle layers. To produce these so-called "current blocking layers," however, the active layer has to be etched in the vicinity of the point at which the radiation is to be produced later, and a second crystal growth process has to be performed on the mesa structure in order to form the "current blocking layers." Etching the active layer and the subsequent further crystal growth, however, have usually resulted in damage to the crystal structure of the active layer, which has a negative effect on radiation production. Furthermore, crystal growth processes on mesa structures generally lead to lower-quality crystals, which likewise have negative effects on the properties of the component.

Therefore, it is the purpose of this invention to make available a semiconductor component for the emission of electromagnetic radiation that minimizes or entirely avoids the mentioned drawbacks of conventional components. It is also the purpose of this invention to make available methods for producing the semiconductor component.

This task is accomplished pursuant to the invention by the semiconductor component for the emission of electromagnetic radiation pursuant to independent Patent claim 1, and by methods for producing a semiconductor component for the emission of electromagnetic radiation pursuant to the independent Patent claims 17, 20, or 23. Other beneficial embodiments, properties, and aspects of this invention are found from the dependent claims, the specification, and the attached drawings.

According to the invention, a semiconductor component for the emission of electromagnetic radiation, especially light, is made available, which has the following features:
 a) an active layer for producing radiation,
 b) a p-type contact that is electrically connected to the active layer,
 c) an n-type contact that is electrically connected to the active layer, and
 d) a current-confining structure to define a current path, with the current-confining structure being provided between the n-type contact and the active layer.

The semiconductor component pursuant to the invention has the advantage that a p-type contact with larger area can be used because of the current-confining structure along the n-type conductive path. No spatial limitation of the p-type contact is necessary. Accordingly, the contact resistance of the p-type contact drops. Depending on the component, this can mean a reduction of contact resistance by 1 to 2 orders of magnitude. The resistance of the component as a whole drops correspondingly, which has positive effects, for example on the threshold current of a semiconductor laser. The thermal load on the contact and on the entire component is also lowered, which in turn is manifested positively in the properties of the component and in its aging characteristics.

Since the current confinement is provided between the n-type contact and the active layer, and the active layer itself is free of current-confining structures, structuring of the active layer, for example etching the active layer to confine current, can be avoided. The active layer can be produced with high quality and in a relatively simple manner after producing the current-confining structure, without the formation of the current-confining structure having a negative effect on the quality of the active layer.

Also according to the invention, a method is made available for producing a semiconductor component for the emission of electromagnetic radiation, especially light, that has the following steps:

a) an n-type conductive substrate is made ready, b) at least one n-type conductive layer is applied to the n-type conductive substrate, c) a current-confining structure is produced with a mask in the n-type conductive layer, d) an active layer for producing radiation is applied to the n-type conductive layer, e) at least one p-type conductive layer is applied to the active layer, and f) a p-type contact and an n-type contact are produced.

According to another aspect of this invention, another method for producing a semiconductor component for the emission of electromagnetic radiation, especially light, is made available, which has the following steps:

a) an n-type conductive substrate is made ready, b) at least one p-type conductive layer and/or electrically insulating layer is applied to the n-type conductive layer, c) an n-type conductive current path is produced with a mask in the p-type conductive and/or electrically insulating layer, so that a current-confining structure is formed, d) an active layer for producing radiation is applied to the p-type conductive and/or electrically insulating layer, e) at least one p-type conductive layer is applied to the active layer, and f) a p-type contact and an n-type contact are produced.

According to another aspect of this invention, another method for producing a semiconductor component for the emission of electromagnetic radiation, especially light, is made available, which has the following steps:

a) an n-type conductive substrate is made ready, b) a current-confining structure is produced with a mask in the n-type conductive substrate, c) at least one n-type conductive layer is applied to the n-type conductive substrate, d) an active layer for producing radiation is applied to the n-type conductive layer, e) at least one p-type conductive layer is applied to the active layer, and f) a p-type contact and an n-type contact are produced.

The methods pursuant to the invention have the advantage that structuring of the active layer for current confinement, for example by etching the active layer, can be avoided. The active layer can be produced with high quality and in a relatively simple manner after producing the current-confining structure, without the formation of the current-confining structure having a negative effect on the quality of the active layer.

Figure 5:
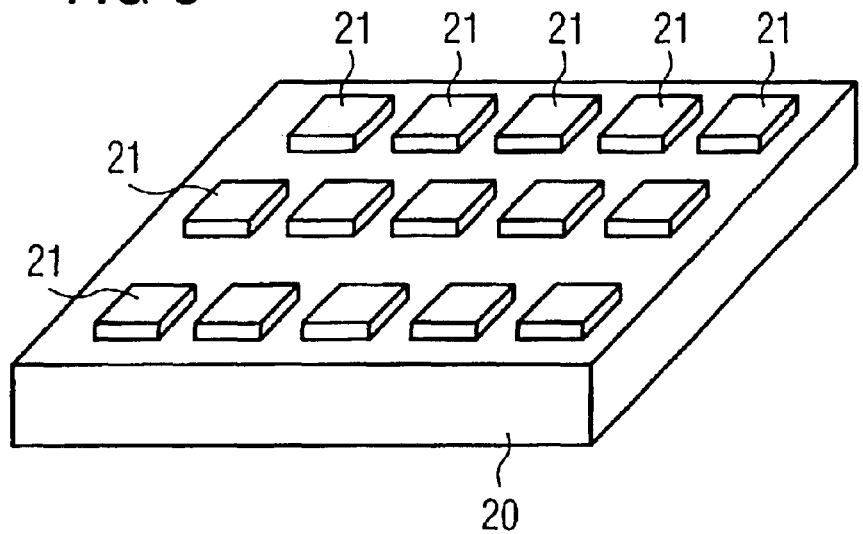
Figure 6:
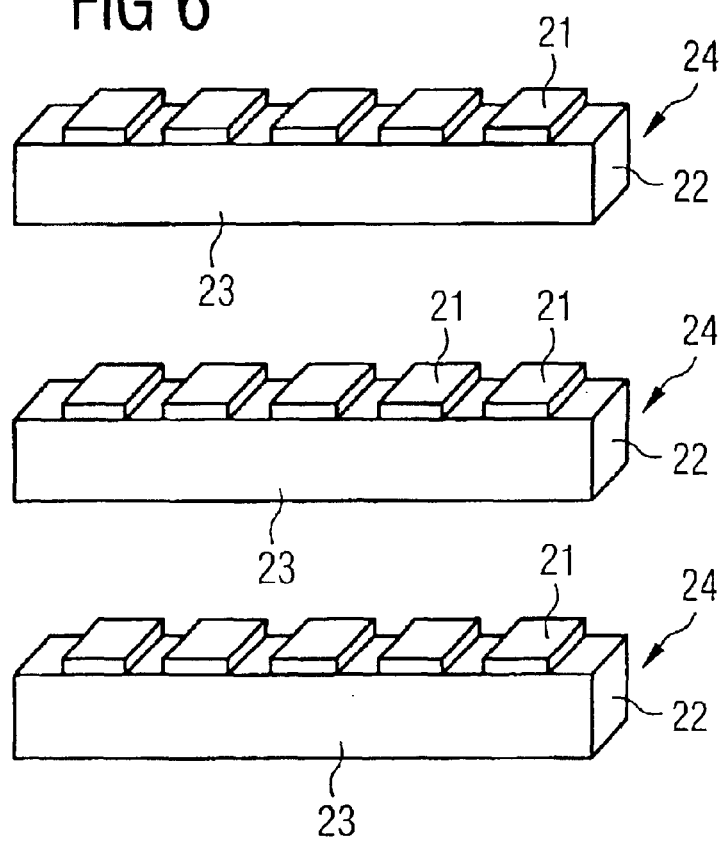
Figure 7:
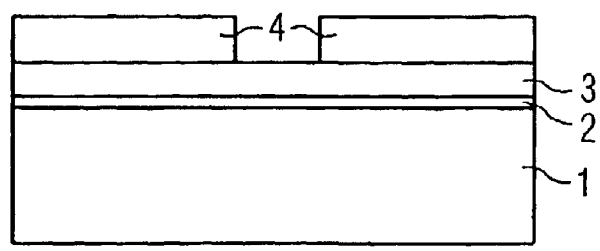
Figure 8:
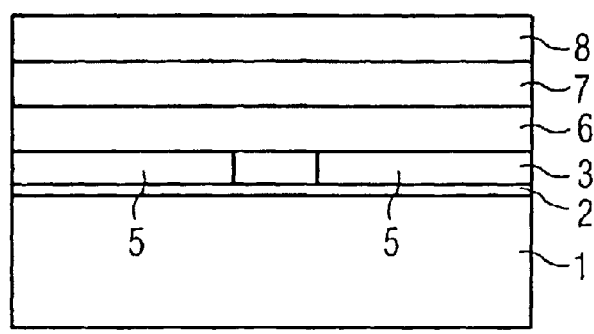
Figure 9:
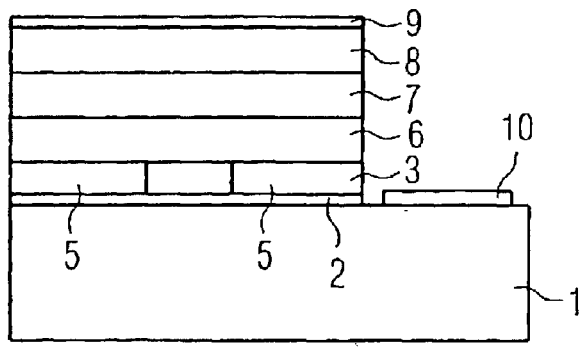
Figure 10:
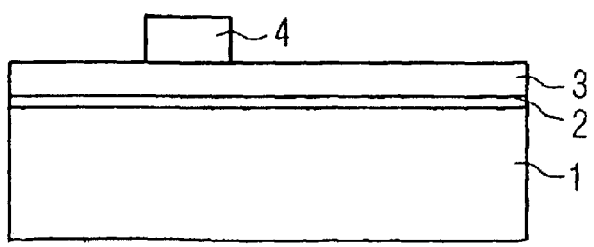
Figure 11:
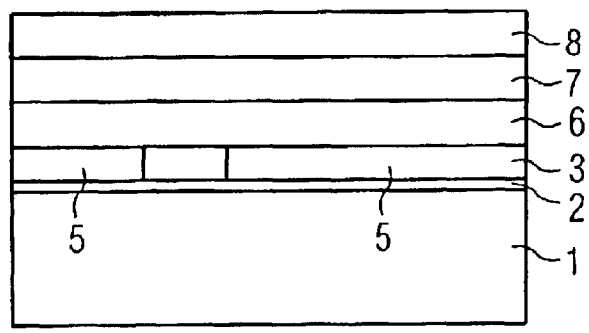
Figure 12:
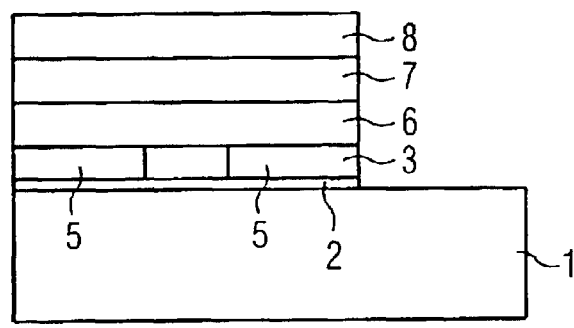
Figure 13:
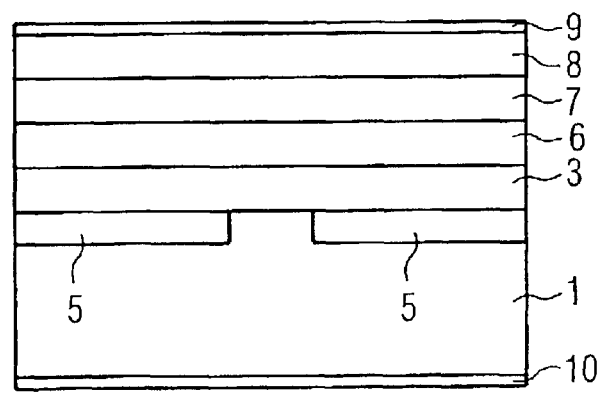
Figure 14:
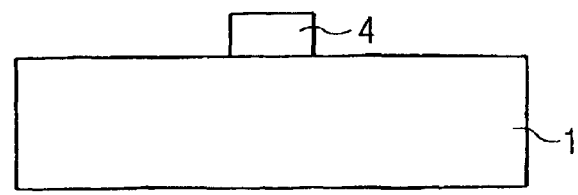
Figure 15:
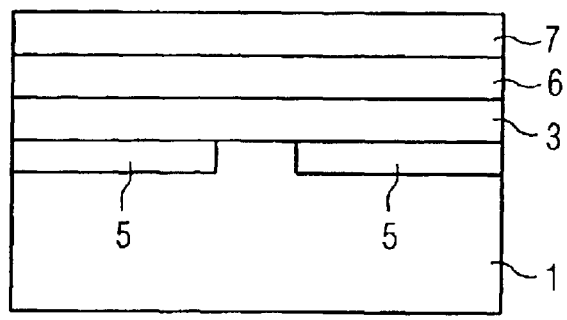
Figure 16:
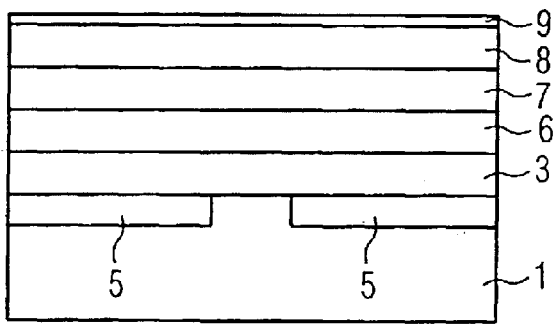
Figure 17:
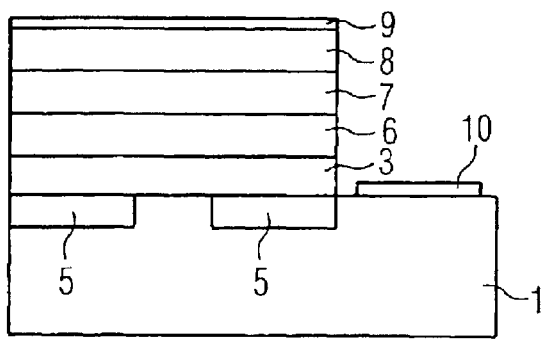
Figure 18:
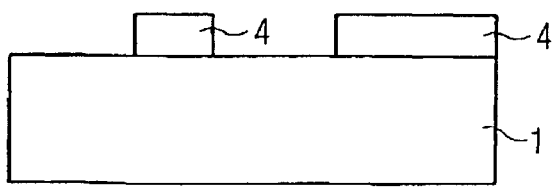

The invention will be described in detail below with reference to the drawings. The drawings show:

FIG. 1 a semiconductor component according to a first embodiment of this invention, FIGS. 2–6 a method for producing a semiconductor laser according to FIG. 1, FIGS. 7–8 another method for producing a semiconductor laser according to FIG. 1, FIG. 9 a semiconductor laser according to a second embodiment of this invention, FIGS. 10–12 a method for producing a semiconductor laser according to FIG. 9, FIG. 13 a semiconductor LED according to a third embodiment of this invention, FIGS. 14–16 a method for producing a semiconductor LED according to FIG. 13, FIG. 17 a semiconductor LED according to a fourth embodiment of this invention, FIGS. 18–20 a method for producing a semiconductor LED according to FIG. 17.

FIG. 1 shows a semiconductor laser according to a first embodiment of this invention. An n-type InAlGaN mantle layer 3 is applied to an n-type GaN substrate over an InAlGaN or GaN interlayer 2. Instead of an n-type GaN substrate, an n-type SiC substrate could also be used. On the n-type InAlGaN mantle layer 3 is placed an active layer 6 that serves to produce the actual radiation. In the present example, the active layer 6 has an MQW structure (Multiple Quantum Well). There is a p-type InAlGaN mantle layer 7 on the active layer 6, which adjoins a p-type GaN contact layer 8. A large-area p-type contact 9 is applied to the top of the p-type GaN contact layer 8. The corresponding n-type contact 10 is placed [on] the bottom of the n-type GaN substrate.

For the spatial confinement of the current flowing through the active layer, a current-confining structure 5 was produced in the InAlGaN mantle layer 3 that constricts the current to the center of the active layer 6. The current-confining structure 5 consists of an insulating region in the InAlGaN mantle layer 3. As an alternative to an insulating region, p-type regions that form a blocked pn-transition can also be used as the current-confining structure 5. Because of the spatial confinement of the current, the laser threshold can be reached in the center of the active layer 6 even with a relatively small current. At the same time, the resistance of the laser is distinctly reduced because of the large-area p-type contact.

Figure 2:
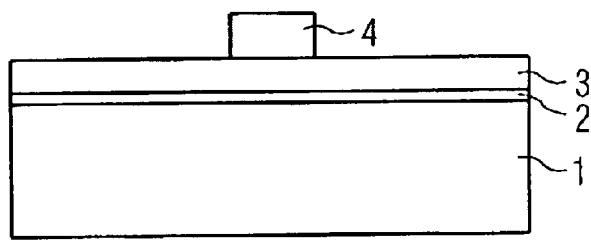

FIGS. 2 to 6 show a method pursuant to the invention for producing a semiconductor laser according to FIG. 1. The n-type InAlGaN or GaN interlayer 2 and the n-type InAlGaN mantle layer 3 are applied in succession to the GaN substrate 1 by epitaxy using MOCVD methods. The interlayer 2 can also be omitted and the InAlGaN mantle layer 3 can be applied directly on the GaN substrate. Also, instead of an MOCVD method, an MBE method (Molecular Beam Epitaxy) can also be used. A mask layer, for example an $Al_2O_3$, $SiO_2$, or $Si_3N_4$ layer is then applied to the n-type InAlGaN mantle layer 3, which is structured to the mask 4 using a photo technique. The situation resulting from this is shown in FIG. 2.

The regions of the n-type InAlGaN mantle layer 3 that are not covered by the mask 4 are now [made] insulating by implantation of hydrogen ions $H^+$, i.e. their resistance is increased by several orders of magnitude. The hydrogen ions $H^+$ can be implanted, for example, with an energy of 100 to 300 keV and a dose of $1\times10^{15}/cm^2$. The insulating regions form the current-confining structure 5, which restricts the current to the center of the active layer 6 still to be produced. As an alternative to the implantation of hydrogen ions $H^+$, a partial oxidation of the InAlGaN mantle layer 3 can also be carried out. To do this, the structure shown in FIG. 2 is exposed to an oxygen atmosphere, whereby the regions of the InAlGaN mantle layer 3 that are not covered by the mask 4 lose their conductive properties. The insulating regions produced in this way in turn form the current-confining structure 5 that restricts the electrical current to the center of the active layer 6 still to be produced.

Instead of insulating regions, p-type regions can also be used as the current-confining structure 5. To this end, p-type dopants such as Mg, Zn, Be, C, or Ca are implanted or diffused into the InAlGaN mantle layer 3 instead of hydrogen ions $H^+$. The mask 4 in this case again protects the region of the InAlGaN mantle layer 3 that is later to serve as an n-type current path. The implantation of p-type dopants can be carried out, for example, with an energy of 60 to 200 keV and a dose of $1 \times 10^{14}$ to $5 \times 10^{16}/cm^2$. The concentration of holes produced with Mg implantation can be increased by co-implantation of phosphorus. The p-type regions with the n-type interlayer 2 and the n-type substrate 1 form a blocking pn-transition, so that the current flow is restricted to the still-remaining n-type region of the InAlGaN mantle layer 3.

Implantation causes defects in the crystal structure of the InAlGaN mantle layer 3. These defects are corrected by an annealing step at a temperature of about 1000° to 1700° C. Since the nitrogen in the InAlGaN mantle layer 3 begins to vaporize at these temperatures, a protective layer (not shown), for example an $SiO_2$ or AlN layer, is applied before the annealing step. This protective layer is removed again after the annealing step. To reduce the defects in the crystal structure, the implantation can also already be carried out at higher temperatures, for example at 500° C.

Figure 3:
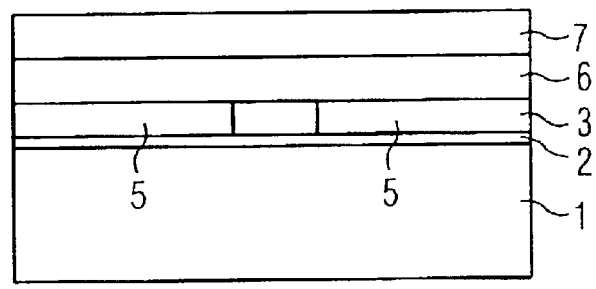
Figure 4:
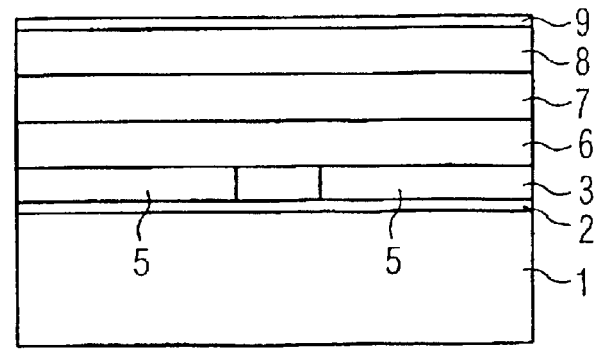

After producing the current-confining structure 5, the mask 4 is removed and an active (InAl)GaN layer 6 and a p-type InAlGaN mantle layer 7 are applied by epitaxy with MOCVD methods. In the present example, the active (InAl)GaN layer 6 has an MQW structure (Multiple Quantum Well), to increase the efficiency of radiation production. Furthermore, the active (InAl)GaN layer 6, the p-type InAlGaN mantle layer 7, and the n-type InAlGaN mantle layer 3 constitute a double-hetero structure in order to increase the efficiency of charge injection into the active (InAl)GaN layer 6. The situation resulting from this is shown in FIG. 3.

Another p-type layer, the GaN contact layer 8, is then applied to the p-type InAlGaN mantle layer 7 by epitaxy. The p-type contact 9 is then produced on the p-type GaN contact layer 8, which results in the situation shown in FIG. 4. After the production of the n-type contact on the bottom of the GaN substrate 1 that then follows, the semiconductor laser is essentially complete.

In the production of semiconductor lasers, a number of semiconductor lasers are produced simultaneously on a semiconductor wafer 20. FIG. 5 shows schematically a semiconductor wafer with a number of semiconductor lasers 21. To finish the semiconductor lasers 21 definitively, the semiconductor wafer 20 is then split into individual bars 22 (FIG. 6). The front faces 23 and the back faces 24 of the bars 22 are then metallized and the semiconductor lasers 21 are singled.

Because the current-confining structure is provided in the semiconductor component of this invention to define a current path between the n-type contact and the active layer, and the active layer does not have to be structured to form current-confining structures, the active layer can be produced in a relatively simple manner and in high quality. At the same time, a larger-area p-type contact can be used, which distinctly reduces the contact resistance of the p-type contact and with it the overall resistance of the semiconductor component.

FIGS. 7 to 8 show another method pursuant to the invention for producing a semiconductor laser according to FIG. 1. In this case, an n-type InAlGaN or GaN interlayer 2 and a p-type InAlGaN mantle layer 3 are applied in succession to the GaN substrate 1 by epitaxy using MOCVD methods. The interlayer 2 can also be omitted and the InAlGaN mantle layer 3 can be applied directly to the GaN substrate. Furthermore, as an alternative, an insulating InAlGaN mantle layer 3, for example by incorporating an insulating dopant such as hydrogen, can also be used. A mask layer, for example an $Al_2O_3$, $SiO_2$, or $Si_3N_4$ layer, is then applied to the p-type (insulating) InAlGaN mantle layer 3, and is structured to the mask 4 using a photo technique. The situation resulting from this is shown in FIG. 7.

The regions of the p-type InAlGaN mantle layer 3 that are not covered by the mask 4 are then [made] n-type conductive by implantation or diffusion of n-dopants, for example Si or O. The n-dopants can be implanted, for example, with an energy of 50 to 100 keV and a dose of $1 \times 10^{14}$ to $5 \times 10^{14}/cm^2$. The remaining p-type regions of the InAlGaN mantle layer 3 form the current-confining structure 5, while the n-type region represents the current path to the active layer still to be formed. As an alternative to implantation of n-type dopants, thermal production of n-type vacant sites in the unprotected regions of the p-type InAlGaN mantle layer 3 can also be carried out.

If an insulating InAlGaN mantle layer 3 is used instead of the p-type conductive InAlGaN mantle layer 3, then the insulating dopant can be driven out of the regions of the insulating InAlGaN mantle layer 3 not covered by the mask 4 by a thermal treatment, which likewise produces an n-type conductive region in the InAlGaN mantle layer 3. To drive out hydrogen, the structure is heated to 700° to 1000° C., for example, preferably to 800° to 900° C. (and with special preference 850° C.).

After producing the current-confining structure 5 the mask 4 is removed, and an active (InAl)GaN layer 6, a p-type InAlGaN mantle layer 7, and a p-type GaN contact layer 8 are applied by epitaxy by MOCVD methods (FIG. 8). The p-type contact 9 and the n-type contact 10 are then produced, whereby the situation shown in FIG. 1 is obtained.

FIG. 9 shows a semiconductor laser according to a second embodiment of this invention. The semiconductor laser shown in FIG. 9 corresponds essentially to the semiconductor laser shown in FIG. 1. In contrast to the semiconductor laser shown in FIG. 1, however, the n-type contact 10 in the semiconductor laser shown in FIG. 9 is located on the top of the substrate 1.

FIGS. 10 to 12 show a method pursuant to the invention for producing a semiconductor laser according to FIG. 9. In this case, the n-type InAlGaN or GaN interlayer 2 and the n-type InAlGaN mantle layer 3 are again applied successively to the GaN substrate 1 by epitaxy using MOCVD methods. A mask layer, for example an $Al_2O_3$, $SiO_2$, or $Si_3N_4$ layer, is then applied to the n-type InAlGaN mantle layer 3, and is structured to the mask 4 using a photo technique. The situation resulting from this is shown in FIG. 10.

The regions of the n-type InAlGaN mantle layer 3 that are not covered by the mask 4 are then [made] insulating by implanting hydrogen ions $H^+$ or by partial oxidation. The insulating regions form the current-confining structure 5, by which the current flow is restricted to the n-type region of the InAlGaN mantle layer 3 that still remains. After producing the current-confining structure 5, the mask 4 is removed and an active (InAl)GaN layer 6, a p-type InAlGaN mantle layer 7, and a p-type GaN contact layer 8 are then applied by epitaxy by MOCVD methods. The situation resulting from this is shown in FIG. 11.

To be able to produce an n-type contact on the top of the substrate 1, the applied layers are etched anisotropically until the surface of the substrate 1 is exposed. This structuring can be carried out, for example, by dry etching using chlorine gas and an $SiO_2$ mask. The situation resulting from this is shown in FIG. 12. The p-type contact and the n-type contact are then produced as shown in FIG. 9.

FIG. 13 shows a semiconductor LED pursuant to a third embodiment of this invention. An n-type InAlGaN mantle layer 3 is applied to an n-type GaN substrate 1. An n-type SiC substrate could also be used instead of an n-type GaN substrate. In this case, however, it is advantageous to use an interlayer between substrate and mantle layer. An active layer 6 that serves to generate the actual radiation is placed on the n-type InAlGaN mantle layer 3. A p-type InAlGaN mantle layer 7 that adjoins a p-type GaN contact layer 8 is placed on the active layer 6. A large-area p-type contact 9 is applied to the top of the p-type GaN contact layer 8. The corresponding n-type contact 10 is located [on] the bottom of the n-type GaN substrate 1.

To spatially confine the current flowing through the active layer, a current-confining structure 5 was produced in the GaN substrate 1, which constricts the current to the center of the active layer 6. The current-confining structure 5 consists of an insulating region in the GaN substrate 1. As an alternative to an insulating region, p-type conductive regions that form a blocked pn-transition can also be used as the current-confining structure 5.

FIGS. 14 to 16 show a method pursuant to the invention for producing a semiconductor LED pursuant to FIG. 13. In this case, a mask layer, for example an $Al_2O_3$, $SiO_2$, or $Si_3N_4$ layer, is applied to the n-type GaN substrate 1, and is structured to the mask 4 using a photo technique. The situation resulting from this is shown in FIG. 14.

The regions of the n-type GaN substrate 1 that are not covered by the mask 4 are then [made] insulating by implantation of hydrogen ions $H^+$ or by partial oxidation. The insulating regions constitute the current-confining structure 5 by which the current flow is restricted to the n-type region of the GaN substrate 1 that still remains. Instead of insulating regions, p-type conductive regions can also be used as the current-confining structure 5. To this end, p-type dopants such as Mg, Zn, Be, or Ca are implanted or diffused into the GaN substrate 1 instead of hydrogen ions $H^+$. The mask 4 in this case again protects the region of the GaN substrate 1 that is later to serve as an n-type conductive current path.

After producing the current-confining structure 5, the mask 4 is removed and an n-type InAlGaN mantle layer 3, an active InGaN layer 6, and a p-type InAlGaN mantle layer 7 are applied by epitaxy using MOCVD methods. In the present example, the active InGaN layer 6, the p-type InAlGaN mantle layer 7, and the n-type InAlGaN mantle layer 3 constitute a double-hetero structure to increase the efficiency of charge injection into the active InGaN layer 6. The situation resulting from this is shown in FIG. 15.

Another p-type layer, the GaN contact layer 8, is then applied by epitaxy to the p-type InAlGaN mantle layer 7. The p-type contact 9 is then produced on the p-type GaN contact layer 8, which results in the situation shown in FIG. 16. After the following production of the n-type contact on the bottom of the GaN substrate 1, the semiconductor LED is then essentially complete.

FIG. 17 shows a semiconductor LED according to a fourth embodiment of this invention. The semiconductor LED shown in FIG. 17 corresponds essentially to the semiconductor LED shown in FIG. 13. In contrast to the semiconductor LED shown in FIG. 13, however, the n-type contact 10 is located on the top of the GaN substrate 1 in the semiconductor LED shown in FIG. 17.

FIGS. 18 to 20 show a method pursuant to the invention for producing a semiconductor LED according to FIG. 17. In this case, the mask layer, for example an $Al_2O_3$, $SiO_2$, or $Si_3N_4$ layer, is again applied to the GaN substrate 1, and is structured to the mask 4 using a photo technique.

The mask 4 covers not only the regions that later serve as the current path, but also the regions on which the n-type contact will later be located. The situation resulting from this is shown in FIG. 18.

The regions of the n-type GaN substrate 1 that are not covered by the mask 4 are then [made] insulating by implantation of hydrogen ions $H^+$ or by partial oxidation. The insulating regions constitute the current-confining structure 5, by which the current flow is restricted to the n-type region of the GaN substrate 1 that still remains.

Instead of insulating regions, p-type regions can also be used as the current-confining structure 5. To this end, p-type dopants such as Mg, Zn, Be, or Ca, are implanted or diffused into the GaN substrate 1 instead of hydrogen ions $H^+$. The mask 4 in this case again protects the regions of the GaN substrate 1 that are later to serve as the n-type current path and the n-type contact. After producing the current-confining structure 5, the mask 4 is removed and an n-type InAlGaN mantle layer 3, an active InGaN layer 6, a p-type InAlGaN mantle layer 7, and a p-type GaN contact layer 8 are applied by epitaxy using MOCVD methods. The situation resulting from this is shown in FIG. 19.

To be able to produce an n-type contact on the top of the GaN substrate 1, the applied layers are etched anisotropically until the surface of the GaN substrate 1 is exposed. This structuring can be performed, for example, by a dry etching method using chlorine gas and an $SiO_2$ mask. The situation resulting from this is shown in FIG. 20. The p-type contact and the n-type contact are then produced, as shown in FIG. 17.

What is claimed is:

1. Semiconductor component for the emission of electromagnetic radiation with:
   a) an active layer to produce radiation,
   b) a p-type contact that is electrically connected to the active layer,
   c) an n-type contact that is electrically connected to the active layer, and
   d) a current-confining structure to define a current path, with the current-confining structure being provided between the n-type contact and the active layer, said active layer being arranged downstream of said current-confining structure in a growth direction.

2. Semiconductor component pursuant to claim 1, characterized by the fact that a p-type mantle layer and an n-type mantle layer are provided, with the active layer being located between the p-type and the n-type mantle layers.

3. Semiconductor component pursuant to claim 1, characterized by the fact that the material of the active layer, of the p-type mantle layer, and of the n-type mantle layer has a composition of the formula $In_xAl_yGa_{1-x-y}N$ with $0 \leq x, y, x+y \leq 1$.

4. Semiconductor component pursuant to claim 2, characterized by the fact that the active layer, the p-type mantle layer, and the n-type mantle layer constitute a double-hetero structure.

5. Semiconductor component pursuant to claim 1, characterized by the fact that the active layer is constructed as an MQW structure.

6. Semiconductor component pursuant to claim 1, characterized by the fact that a substrate is provided.

7. Semiconductor component pursuant to claim 6, characterized by the fact that an n-type GaN substrate or an n-type SiC substrate is provided.

8. Semiconductor component pursuant to claim 2, characterized by the fact that a substrate is provided, and the n-type mantle layer is connected to the substrate over at least one interlayer.

9. Semiconductor component pursuant to claim 1, characterized by the fact that the active layer, the p-type mantle layer, the n-type mantle layer, and the interlayer are constructed as epitaxial layers.

10. Semiconductor component pursuant to claim 6, characterized by the fact that the n-type contact is located on the face of the substrate opposite the n-type mantle layer.

11. Semiconductor component pursuant to claim 1, characterized by the fact that the current-confining structure is made up of at least one insulating region.

12. Semiconductor component pursuant to claim 11, characterized by the fact that the insulating region is formed by oxidation or by implantation or diffusion of hydrogen.

13. Semiconductor component pursuant to claim 1, characterized by the fact that the current-confining structure is made up of at least one p-type region.

14. Semiconductor component pursuant to claim 13, characterized by the fact that the p-type region is formed by implantation or diffusion of Mg, Zn, Be, or Ca.

15. Semiconductor component pursuant to claim 5, characterized by the fact that the current-confining structure is located in the substrate.

16. Semiconductor component pursuant to claim 9, characterized by the fact that the current-confining structure is located in an epitaxial layer.

17. Method for producing a semiconductor component for the emission of electromagnetic radiation with the steps:
   a) an n-type substrate is made ready,
   b) at least one n-type layer is applied to the n-type substrate,
   c) a current-confining structure is produced in said n-type layer with a mask,
   d) an active layer for producing radiation is applied to the n-type layer,
   e) at least one p-type layer is applied to the active layer, and
   f) a p-type contact and an n-type contact are produced.

18. Method pursuant to claim 17, characterized by the fact that the current-confining structure is produced by diffusion or implantation of a p-type dopant.

19. Method pursuant to claim 17, characterized by the fact that the current-confining structure is produced by diffusion or implantation of hydrogen or by partial oxidation.

20. Method for producing a semiconductor component for the emission of electromagnetic radiation with the steps:
   a) an n-type substrate is made ready,
   b) at least one p-type and/or electrically insulating layer is applied to said n-type substrate,
   c) an n-type current path is produced with a mask in the p-type and/or electrically insulating layer, so that a current-confining structure is formed,
   d) an active layer for producing radiation is applied to the p-type and/or electrically insulating layer,
   e) at least one p-type layer is applied to the active layer, and
   f) a p-type contact and an n-type contact are produced.

21. Method pursuant to claim 20, characterized by the fact that the current path is produced by diffusion or implantation of an n-type dopant.

22. Method pursuant to claim 20, characterized by the fact that an insulating layer is produced by the incorporation of hydrogen, and the current path is produced by driving out hydrogen thermally.

23. Method for producing a semiconductor component for the emission of electromagnetic radiation with the steps:
   a) an n-type substrate is made ready,
   b) a current-confining structure is produced in the n-type substrate with a mask,
   c) at least one n-type layer is applied to the n-type substrate,
   d) an active layer for producing radiation is applied to the n-type layer,
   e) at least one p-type layer is applied to the active layer, and
   f) a p-type contact and an n-type contact are produced.

24. Method pursuant to claim 23, characterized by the fact that the current-confining structure is produced by diffusion or implantation of a p-type dopant.

25. Method pursuant to claim 23, characterized by the fact that the current-confining structure is produced by diffusion or implantation of hydrogen or by partial oxidation.

26. Method pursuant to claim 17, characterized by the fact that an $Al_2O_3$, $SiO_2$, or $Si_3N_4$ mask is used as the mask.

27. The component of claim 1 wherein said electromagnetic radiation is light.

28. The method of claim 17 wherein said electromagnetic radiation is light.

29. The method of claim 20 wherein said electromagnetic radiation is light.

30. The method of claim 23 wherein said electromagnetic radiation is light.

31. The component of claim 6 wherein said substrate is an n-type substrate.

* * * * *